United States Patent [19]

Takigawa

[11] Patent Number: 4,457,803

[45] Date of Patent: Jul. 3, 1984

[54] PROCESSING METHOD USING A FOCUSED ION BEAM

[75] Inventor: Tadahiro Takigawa, Tokyo, Japan

[73] Assignee: Tokyo Shibaura Denki Kabushiki Kaisha, Kawasaki, Japan

[21] Appl. No.: 447,762

[22] Filed: Dec. 8, 1982

[30] Foreign Application Priority Data

Dec. 18, 1981 [JP] Japan .................................. 56-205016

[51] Int. Cl.³ ...................... H01L 21/306; B44C 1/22; C03C 15/00; C23F 1/02
[52] U.S. Cl. .................................... 156/626; 156/643; 156/657; 156/662; 156/345; 204/192 E; 204/298; 250/492.2; 250/492.3
[58] Field of Search ............... 156/643, 654, 657, 662, 156/626, 627, 656, 345; 204/192 E, 192 EC, 298; 250/492.1, 492.2, 492.3

[56] References Cited

U.S. PATENT DOCUMENTS 3,563,809  2/1971  Wilson ................................ 148/1.5

Primary Examiner—William A. Powell
Attorney, Agent, or Firm—Oblon, Fisher, Spivak, McClelland & Maier

[57] ABSTRACT

A processing method using a focused ion beam is proposed which uses a focused ion beam radiation apparatus. When a specimen is irradiated with the focused ion beam in order to be etched, the desired etching depth of the specimen is preset as a function of a location. The ion dose of the focused ion beam, the acceleration voltage, or the etching time may be varied in accordance with the preset data.

4 Claims, 12 Drawing Figures

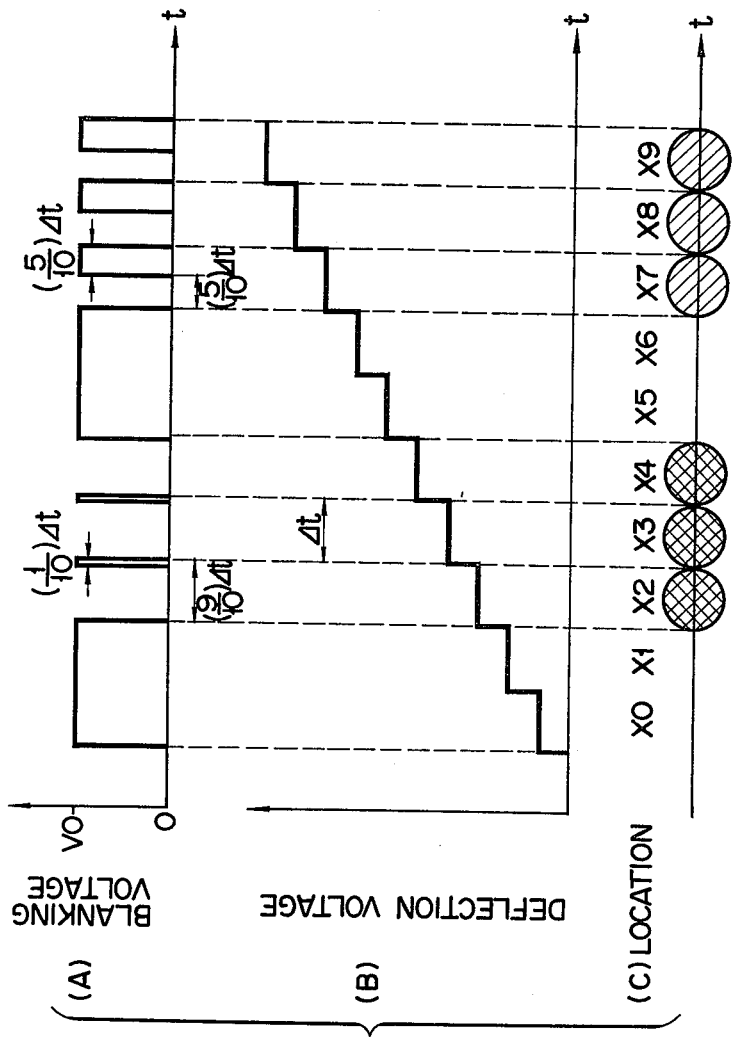

PROCESSING METHOD USING A FOCUSED ION BEAM

BACKGROUND OF THE INVENTION

The present invention relates to a processing method using a focused ion beam and, more particularly, to a method for forming a three-dimensional pattern by etching using a focused ion beam.

Various etching methods are known as techniques for forming micropatterns on a specimen such as a silicon wafer in the manufacturing process of semiconductor devices. The etching method using an ion beam, in particular, is receiving a lot of attention. The ion beam method is classified, on the basis of the physical mechanism, into sputter etching, accelerated ion etching, ion beam assist etching, reactive ion etching and the like. A method is selected in accordance with the actual etching purpose.

FIGS. 1A and 1B are sectional views showing etching steps using sputter etching. As shown in FIG. 1A, after forming resist patterns 2 on a specimen 1 to be processed such as a silicon wafer, the structure is irradiated all at once with an Ar+ ion beam or the like having a relatively large and uniform spot diameter. Thus, using the resist patterns 2 as masks, processing regions 3 are formed by etching, as shown in FIG. 1B. Conventionally, desired regions are selectively etched in this manner by irradiation with an ion beam having a relatively large and uniform spot diameter.

However, the conventional method described above is subject to various drawbacks. Since the entire structure is irradiated all at one with an ion beam, the etching depth becomes uniform at all locations of the structure. For this reason, if etching to different depths is to be performed at selected regions, a plurality of etching steps and a plurality of masks are required, resulting in complex procedures. Furthermore, it is difficult to form patterns 4 and 5 of arbitrary cross-sectional shape, as shown in FIG. 2.

SUMMARY OF THE INVENTION

It is an object of the present invention to provide a processing method using a focused ion beam wherein regions of arbitrary sectional shape may be formed in a specimen to be processed by etching with a focused ion beam.

This object is achieved by the present invention by a processing method using a focused ion beam, which uses a focused ion beam radiation apparatus comprising an ion gun and an ion optical system for producing a micro ion beam, and has a deflecting function to scan the ion beam on a wafer surface and a blanking function to blank the ion beam. In order to perform selective etching of a wafer in accordance with this method, desired etching depths of the wafer are preset as a function of location. The dose of the ion beam, the acceleration voltage, or the etching time may be varied in accordance with the preset data.

According to the method of the present invention, since the etching depth may be varied according to an etching location of the wafer, a pattern of arbitrary cross-sectional shape may be formed on an arbitrarily selected region of the sample.

BRIEF DESCRIPTION OF THE DRAWINGS

By way of example and to make the description clearer, reference is made to the accompanying drawings in which:

FIGS. 5A to 5C are timing charts for explaining the operation for varying the ion dose from the apparatus shown in FIG. 4;

DETAILED DESCRIPTION OF THE PREFERRED EMBODIMENTS

The etching depth in sputter etching is known to hold a linear relation with the etching time. Utilizing this linear relation, the impurity profile in the direction of depth within a substance is determined in an ion microanalyzer or an Auger electron spectrometry apparatus. If the etching time remains constant, etching depth S holds a linear relation with the acceleration energy and is expressed by:

$$S = K(E/\lambda) M_1 M_2 / (M_1 + M_2)^2$$

where E is the acceleration energy, $\lambda$ is the mean free path of radiated ions in the substance, $M_1$ is the mass number of radiated ions, and $M_2$ is the mass number of the irradiated substance.

Figure 1A:
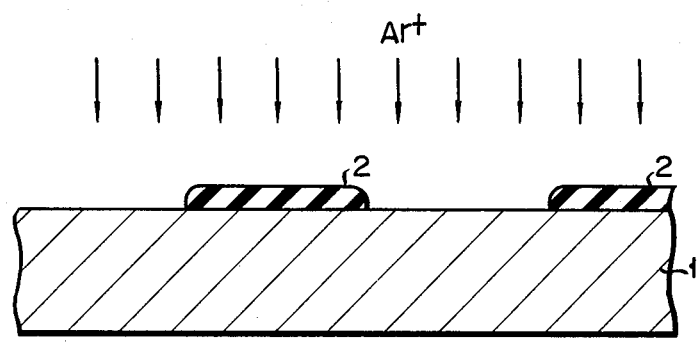
FIGS. 1A and 1B are sectional views showing conventional etching steps using an ion beam.
Figure 1B:
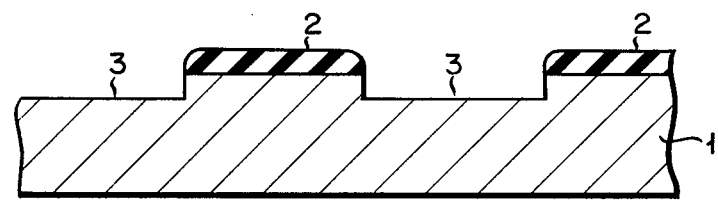
Figure 2:
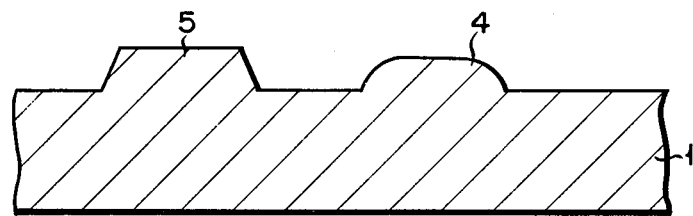
FIG. 2 is a sectional view of a pattern which is difficult to form with the conventional etching method using an ion beam shown in FIGS. 1A and 1B.
Figure 3:
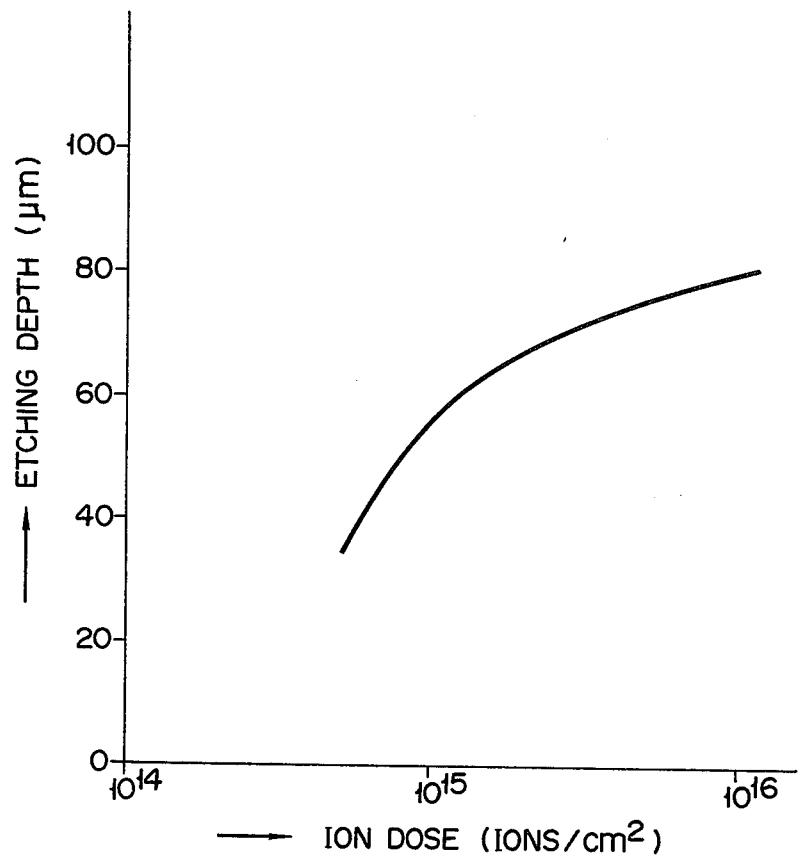
FIG. 3 is a graph showing the etching depth by ion bombardment as a function of the ion dose.

Etching by accelerated ion etching is performed by bombarding a sample with ions and then etching with a 3% hydrogen fluoride solution, for example. As may be seen from FIG. 3, the etching depth is determined in accordance with the ion dose, the type of ions, the etching time and the like. Although not shown in the graph, the etching depth increases with an increase in the acceleration energy. Therefore, a pattern having a cross-sectional shape as shown in FIG. 2 may be formed by controlling the etching time of a micro ion beam, the type of ions, the ion dose, the acceleration voltage and the like. The present invention is based on such a principle.

Figure 4:
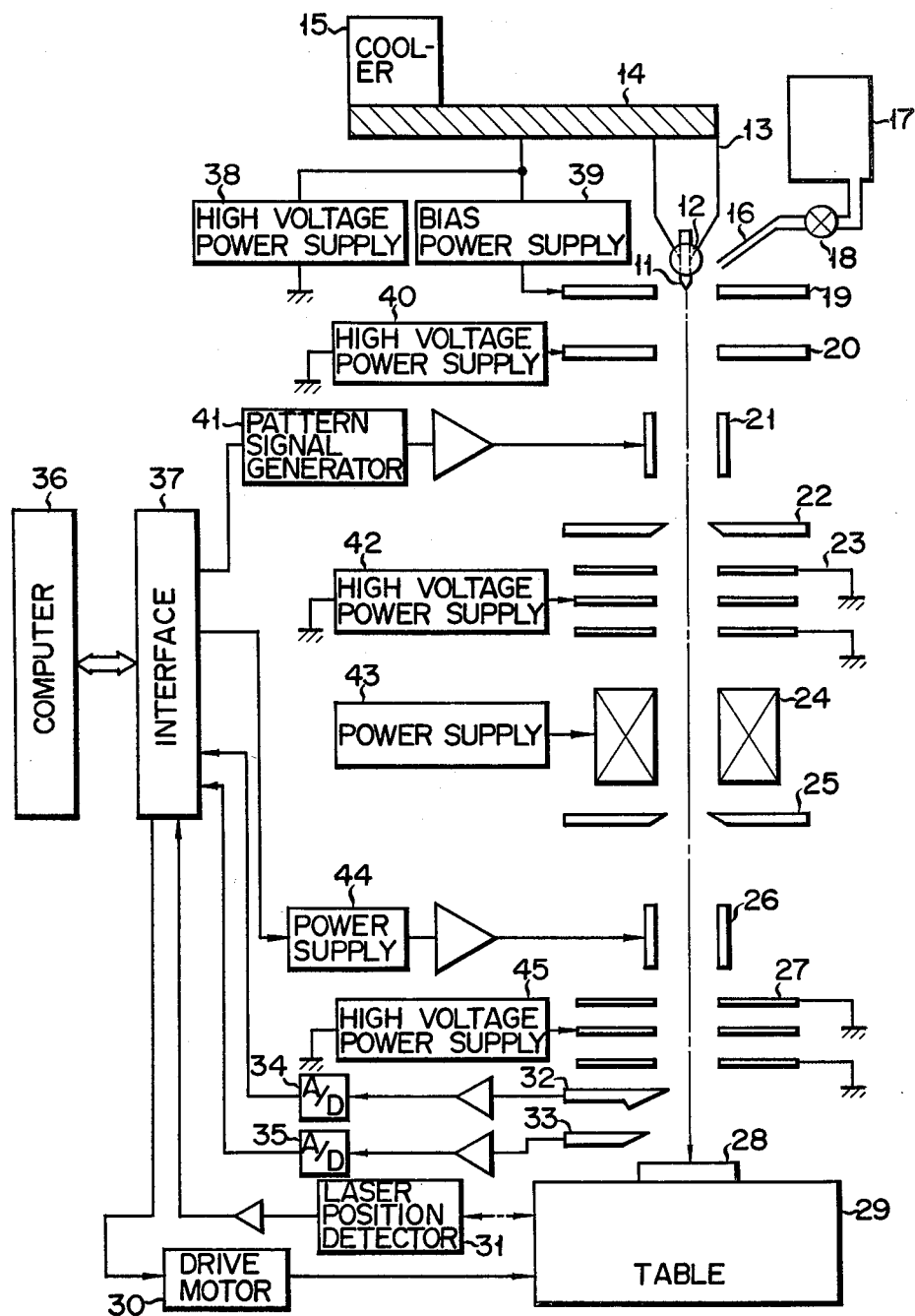
FIG. 4 is a schematic block diagram of a focused ion beam radiation apparatus used according to an embodiment of the present invention.

FIG. 4 is a schematic block diagram of a focused ion beam scanner which is used in an embodiment of the present invention. Referring to FIG. 4, an emitter 11 held by a wire-like holder 13 is cooled by liquid nitrogen or liquid helium. Argon gas 12 is liquefied on the surface of the emitter 11. A thermal conductor 14 arranged below a cooler 15 is for cooling the emitter 11. An injection nozzle 16 is for injecting argon gas from an argon gas cylinder 17. A valve 18 controls the injection rate of the argon gas. Grid electrodes 19 and ion drawing electrodes 20 form an ion gun to produce a micro ion beam. Blanking electrodes 21 turn the ion beam ON/OFF. A blanking aperture mask 22 is disposed below the blanking electrodes 21. Electrostatic lenses or condenser lenses 23 of Einzel type focus the ion beam. Reference numeral 24 denotes the deflection coil of a mass analyzer of EXB type. An ion selection aperture mask 25 selects the ions to be bombarded onto the specimen. A deflector 26 scans the ion beam on the specimen surface. Electrostaic lenses or objective lenses 27 are also of Einzel type. A specimen 28 such as a silicon wafer is placed on a specimen table 29. The specimen table 29 is driven by a drive motor 30, and its position is detected by a laser position detector 31. A reflected ion detector 32 is used for registration, and a secondary ion detector 33 is arranged therebelow. A/D converters 34 and 35 convert the analog signals from the detectors 32 and 33, respectively, into digital signals. A computer 36 is used to perform various types of control operations, and an interface 37 is connected thereto. A high voltage power supply 38 is used to supply power to the ion gun. Reference numeral 39 denotes a bias power supply. A high voltage power supply 40 is used to supply power to the ion drawing electrodes 20. Reference numeral 41 denotes a pattern signal generator. A high voltage power supply 42 is used to supply power to the condenser lenses 23. A power supply 43 is used to produce an electric field and a magnetic field of the mass analyzer 24. A deflecting power supply 44 is used to supply power to the deflector 26. A high voltage power supply 45 is used to supply power to the objective lenses 27.

The focused ion beam scanner of the configuration described above operates in the same manner as does a known electron beam scanner, for example, as disclosed in U.S. Pat. No. 4,063,103. The ion dose in the specimen surface such as a silicon wafer may be varied in the following manner. Assume that voltage V0 is applied to the blanking electrodes 21 to turn OFF (blank) the ion beam. Assume also that the deflection voltage has a stepped waveform as shown in FIG. 5B to scan the ion beam in a stepped form. Let $\Delta t$ stand for a time interval in which the ion beam stays at a location $x_n$, the pulse width of the blanking signal being variable in units of $(1/10)\Delta t$. Then, when the blanking voltage in the mass analyzer is varied as shown in FIG. 5A, the ion beam is OFF at locations x0, x1, x5 and x6. The ON time of the ion beam is $(9/10)\Delta t$ at locations x2, x3 and x4. The ON time of the ion beam is $(5/10)\Delta t$ at locations x7, x8 and x9. In this manner, the dose of the ion beam may be varied in 10 steps at each location.

Figure 6A:
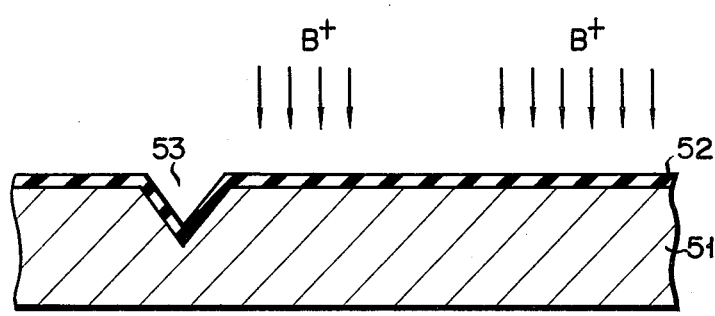
FIGS. 6A to 6E are sectional views showing steps for manufacturing a MOS according to the method of the embodiment of the present invention.
Figure 6B:
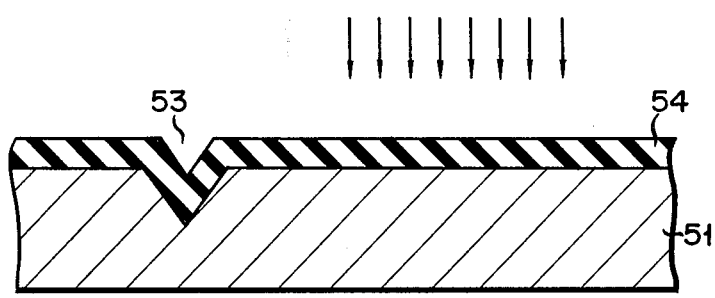
Figure 6C:
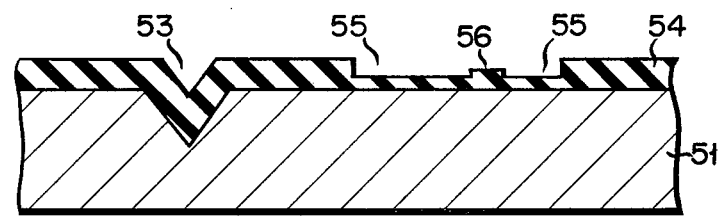

An example will be described wherein the method of the present invention using a focused ion beam scanner is applied to the manufacture of a MOS transistor. First, as shown in FIG. 6A, a silicon wafer 51 is annealed in an oxygen atmosphere for 30 minutes to form an oxide film 52 of about 1,000 Å thickness on the upper surface of the silicon wafer 51. Reference numeral 53 denotes an alignment mark. Referring to the alignment mark 53, a focused beam of B+ ions is irradiated onto a prospective field region and the oxide film 52 is removed. Subsequently, the silicon wafer 51 is heated at 1,000° C. to form a thermal oxide film (sample) 54 of 5,000 Å thickness as shown in FIG. 6B. Thereafter, using the focused ion beam scanner as described above, the oxide film 54 is etched. At this time, the positions of regions 55 and 56 are determined with reference to the alignment mark 53 and the etching depths at the regions 55 and 56 are varied as shown in FIG. 6C. The oxide film 54 has a thickness of 200 Å at the region 55 and a thickness of 500 Å at the region 56. The regions 55 and 56 correspond to the element formation region for forming the MOS transistor.

Figure 6D:
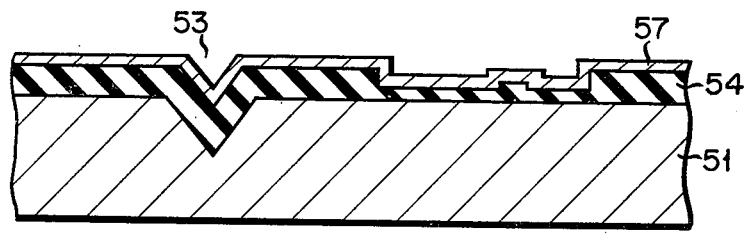
Figure 6E:
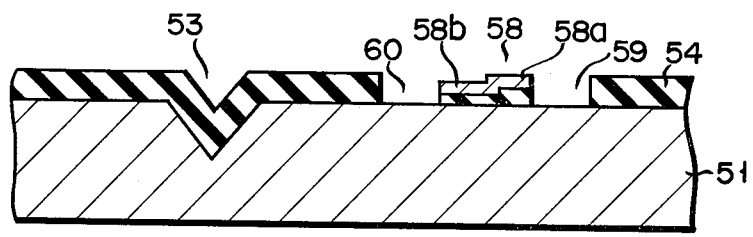

B+ ions are implanted at an acceleration voltage of 50 keV into the regions 55 and 56 including the channel region so as to control the threshold voltage VTH. Thereafter, as shown in FIG. 6D, a molybdenum film 57 of 1,000 Å thickness is deposited on the oxide film 54. Referring to the alignment mark 53, the molybdenum film 57 and the oxide film 54 are selectively etched to form a gate electrode 58, as shown in FIG. 6E. Referring to this figure, reference numeral 59 denotes a prospective drain region, and reference numeral 60 denotes a prospective source region. In the gate electrode 58 formed in this manner, the thickness of the oxide film 54 at a portion 58a contiguous with the prospective drain region 59 is greater than that at a portion 58b contiguous with the prospective source region 60. For this reason, the punch-through phenomenon is prevented, and a high breakdown voltage is obtained.

According to the method of the present invention, the etching depth may be varied by varying the ion dose, the ON time, the acceleration voltage and the like of a focused ion beam, thus providing a simpler and shorter method for manufacturing LSIs. Especially in the case of an LSI, the width of the gate electrode 58 is very narrow. The stepped processing of the oxide film 54 may be realized only by the method of the present invention. During selective etching of the molybdenum film 57 and the oxide film 54 for forming the gate electrode 58, the secondary ions are analyzed by the secondary ion detector. Therefore, completion of the etching process may be easily confirmed to make the method of the present invention even easier to put into practice.

Figure 7:
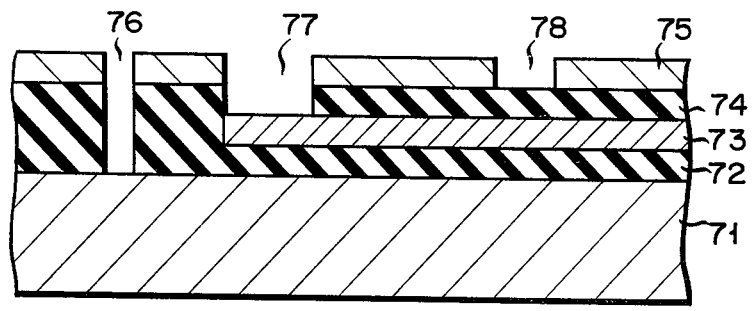
FIG. 7 is a sectional view for explaining another embodiment of the present invention.

The present invention is not limited to the embodiment described above. For example, the present invention can be applied to formation of contact holes for a multilayer wiring structure as shown in FIG. 7. Referring to FIG. 7, reference numeral 71 denotes a silicon wafer; 72, a first insulating oxide film; 73, a first metal wiring layer; 74, a second insulating oxide film; 75, a second metal wiring layer; and 76, 77 and 78, contact holes, respectively. In this example, the etching depths are varied by performing etching of regions to be processed and then analyzing the secondary ion analysis results. Etching as shown in FIG. 2 can also be performed by presetting the etching depth as a function of location.

In the examples described above, completion of the etching process is confirmed by analyzing the secondary ions. However, it may alternatively be performed by ion-excited X-rays, ion-excited fluorescent rays, ion-excited Auger electrons or the like. The present invention is not limited to sputter etching and may be similarly applied to accelerated ion etching. Various other changes and modifications may be made within the spirit and scope of the present invention.

What is claimed is:

1. A processing method using a focused ion beam, which uses a focused ion beam radiation apparatus comprising an ion gun and an ion optical system for producing a micro ion beam, a deflecting device for scanning the ion beam on a surface of a wafer, a blanking device for blanking the ion beam, and a control device for controlling said devices, thereby etching the wafer by irradiation thereof with the focused ion beam, comprising the steps of:

determining a desired etching depth of the wafer as a function of a location and presetting data of the etching depth in said control device; and controlling said blanking device in accordance with said data so as to vary a radiation time of the ion beam.

2. A method according to claim 1 further comprising the step of detecting the completion of etching of the wafer with the ion beam.

3. A method according to claim 1, wherein the ion beam radiation time is varied by changing a pulse width of a blanking signal from said blanking device.

4. A method according to claim 1, wherein the ion beam is scanned in a stepped form.

* * * * *